(12) United States Patent
Bedinger et al.

(10) Patent No.: US 8,857,050 B2
(45) Date of Patent: *Oct. 14, 2014

(54) METHODS OF MAKING AN ENVIRONMENT PROTECTION COATING SYSTEM

(75) Inventors: John M. Bedinger, Garland, TX (US); Michael A. Moore, Fort Worth, TX (US)

(73) Assignee: Raytheon Company, Waltham, MA (US)

( * ) Notice: Subject to any disclaimer, the term of this patent is extended or adjusted under 35 U.S.C. 154(b) by 1476 days.

This patent is subject to a terminal disclaimer.

(21) Appl. No.: 12/533,503

(22) Filed: Jul. 31, 2009

(65) Prior Publication Data

US 2009/0291200 A1 Nov. 26, 2009

Related U.S. Application Data

(62) Division of application No. 11/848,891, filed on Aug. 31, 2007, now Pat. No. 8,173,906.

(60) Provisional application No. 60/888,715, filed on Feb. 7, 2007.

(51) Int. Cl.
*H05K 3/30* (2006.01)
*H05K 3/28* (2006.01)
*H01L 23/482* (2006.01)
*H01L 23/31* (2006.01)
*H01L 23/00* (2006.01)

(52) U.S. Cl.
CPC ...... *H05K 3/284* (2013.01); *H01L 2224/73265* (2013.01); *H05K 2201/0179* (2013.01);
(Continued)

(58) Field of Classification Search
USPC ........ 29/841, 527.2, 825, 829, 832, 846, 855; 257/E21.414, E23.119, E23.126, 257/E29.137, E29.151
See application file for complete search history.

(56) References Cited

U.S. PATENT DOCUMENTS 3,890,636 A 6/1975 Harada et al.
5,548,099 A 8/1996 Cole, Jr. et al.
(Continued)

FOREIGN PATENT DOCUMENTS

DE 197 19 179 A1 3/1998
EP 1 732 149 A1 12/2009
(Continued)

OTHER PUBLICATIONS

State Intellectual Property Office of the People's Republic of China, The First Office Action, Date of Issue: Aug. 24, 2010, Application No. 200880011449, 9 pages.
(Continued)

*Primary Examiner* — Thiem Phan
(74) *Attorney, Agent, or Firm* — Lando & Anastasi, LLP (57) ABSTRACT

A method includes providing a circuit board having an outer surface, the outer surface configured with a plurality of discrete electrical components that are each manufactured independently of one another, and coating the outer surface and the plurality of discrete electrical components with a first protective dielectric layer. The method further includes coating the first protective dielectric layer with a second dielectric layer. The second dielectric layer includes a dielectric material having a modulus of elasticity less than 3.5 Giga-Pascal (GPa), a dielectric constant less than 2.7, a dielectric loss less than 0.002, a breakdown voltage strength in excess of 2 million volts/centimeter (MV/cm), a temperature stability to 3000 Celsius, a defect densities less than 0.5/centimeter, a pinhole free in films greater than 50 Angstroms, and is capable of being deposited conformally over and under 3D structures with thickness uniformity less than or equal to 10%.

18 Claims, 9 Drawing Sheets

(52) U.S. Cl.
CPC . *H01L 2924/1423* (2013.01); *H05K 2203/1322* (2013.01); *H01L 2924/19041* (2013.01); *H01L 2924/01004* (2013.01); H01L 23/4821 (2013.01); *H01L 2924/01019* (2013.01); *H01L 24/83* (2013.01); H01L 23/3192 (2013.01); *H01L 2224/83801* (2013.01); *H01L 2224/83851* (2013.01); *H01L 2924/0781* (2013.01); *H05K 2201/0195* (2013.01); *H01L 2224/8592* (2013.01)
USPC .............. 29/841; 29/527.2; 29/829; 29/846

(56) References Cited

U.S. PATENT DOCUMENTS

| | | | |
|---|---|---|---|
| 5,949,144 | A | 9/1999 | Delgado et al. |
| 5,968,386 | A | 10/1999 | Goenka et al. |
| 6,094,360 | A | 7/2000 | Lange et al. |
| 6,489,233 | B2 | 12/2002 | Chooi et al. |
| 6,509,601 | B1 | 1/2003 | Lee et al. |
| 6,573,124 | B1 * | 6/2003 | Chou et al. .................. 438/126 |
| 6,607,934 | B2 | 8/2003 | Chang et al. |
| 6,624,063 | B2 | 9/2003 | Hasegawa et al. |
| 6,900,383 | B2 | 5/2005 | Babb et al. |
| 6,956,283 | B1 | 10/2005 | Peterson |
| 7,344,972 | B2 | 3/2008 | Goodner et al. |
| 7,902,083 | B2 | 3/2011 | Bedinger |
| 2003/0034564 | A1 | 2/2003 | Palanisamy et al. |
| 2003/0141096 | A1 | 7/2003 | Saccomanno |
| 2005/0048695 | A1 | 3/2005 | Chia et al. |
| 2006/0006798 | A1 | 1/2006 | Buckley |
| 2006/0091548 | A1 | 5/2006 | Naiki et al. |
| 2007/0054127 | A1 | 3/2007 | Hergenrother et al. |
| 2007/0178710 | A1 * | 8/2007 | Muyres et al. ................ 438/778 |
| 2008/0185173 | A1 | 8/2008 | Bedinger et al. |
| 2008/0185174 | A1 | 8/2008 | Bedinger et al. |
| 2008/0246136 | A1 | 10/2008 | Haba et al. |
| 2009/0134401 | A1 | 5/2009 | Maekawa |
| 2009/0191665 | A1 | 7/2009 | Nikitin et al. |
| 2009/0288876 | A1 | 11/2009 | Bedinger et al. |
| 2009/0290314 | A1 | 11/2009 | Bedinger et al. |
| 2009/0291200 | A1 | 11/2009 | Bedinger et al. |
| 2010/0120254 | A1 | 5/2010 | Bedinger et al. |

FOREIGN PATENT DOCUMENTS

| | | |
|---|---|---|
| JP | 02 307247 A | 12/1990 |
| WO | WO 2005/020343 | 3/2005 |

OTHER PUBLICATIONS

The First Office Action, Chinese Translation, Application No. 200880011449, 6 pages, Aug. 24, 2010.
EPO, Communication Pursuant to Article 94(3) EPC, Application No. 08 250 440.8-2210, Mar. 14, 2011, 4 pages.
Bedinger et al., "Response Pursuant to 37 C.F.R. 1.111," filed Dec. 3, 2010, 12 pages.
Bedinger et al., "Office Action Summary," Mailed Jan. 28, 2011, U.S. Appl. No. 12/533,448, 16 pages.
Bedinger et al., "Office Action Summary," Mailed Jan. 28, 2011, U.S. Appl. No. 11/848,891, 14 pages (1588).
Bedinger et al., "Response Pursuant to 37 C.F.R. 1.111," filed Apr. 28, 2011, 12 pages.
Bedinger et al., "Response Accompanying RCE and RCE Transmittal," filed Apr. 28, 2011, 13 pages.
European Search Report, Application No. 08 728 219.0-1235, Mar. 9, 2010, 3 pages.
USPTO, Notification of Office Action, notification Date Mar. 16, 2010, U.S. Appl. No. 11/848,891, 12 pages, (1588).
U.S. Patent Application, Bedinger et al., "Passive Layer for a Circuit Device and Method of Manufacture," filed Jan. 12, 2010, U.S. Appl. No. 12/691,216, 44 pages, 9 pages drawings.
Notice of Office Communication, "Election Restriction Requirement," United States Patent and Trademark Office, U.S. Appl. No. 11/848,891, 8 pages, sent May 19, 2009, 1588.
Notice of Office Communication, "Election Restriction Requirement," United States Patent and Trademark Office, U.S. Appl. No. 11/848,820, 8 pages, sent May 19, 2009, 1589.
Bedinger, "Response to Election Restriction Requirement," electronically filed with the USPTO on Jun. 19, 2009, 2 pages.
European Patent Office, Communication for Application No. 08250440.8-2210/1956872, Mailed Jul. 8, 2009, 5 pages.
PCT Invitation to Pay Additional Fees, and Where Applicable, Protest Fee, partial search by ISA/EPO, for PCT/US2008/051919, 10 pages, Mailed Jun. 25, 2008.
Bedinger et al., "Environmental Protection Coating System and Method," U.S. App. No. 11/848,891, 57 pages, 9 pages of drawings, filed Aug. 31, 2007 1588.
Bedinger et al., "Passivation Layer for a Circuit Device and Method of Manufacture," U.S. App. No. 11/848,820, 45 pages, 9 pages of drawings, filed Aug. 31, 2007 1589.
Bedinger et al., "Environmental Protection Coating System and Method," U.S. App. No. 12/533,409, 40 pages, 9 pages of drawings 1980.
Bedinger et al., "Environmental Protection Coating System and Method," U.S. App. No. 12/533,448, 36 pages, 9 pages of drawings 1981.
European Search Report, Application No. 08250440.8-2210/ 1956872, Sep. 23, 2009, 9 pages.
United States Patent and Trademark Office, Notification of Office Action, notification Date Sep. 15, 2009, U.S. Appl. No. 11/848,891, 13 pages (1588).
Response to Office Action, filed Dec. 16, 2009, U.S Appl. No. 11/848,891, 23 pages (1588).
European Patent Office, "Communication Pursuant to Article 94(3) EPC," Application No. 08 250 440.8-2210, Aug. 11, 2010, 4 pages (1588).
Bedinger et al., USPTO, Office Action, U.S. Appl. No. 12/533,448, Mailed Aug. 3, 2010, 13 pages (1588).
Bedinger et al., "Response Pursuant to 37 C.F.R. 1.111," Filed Aug. 13, 2010, 22 pages, U.S. Appl. No. 12/533,448 (1981).
Bedinger et al., "Office Action Summary," Mailed Sep. 16, 2010, U.S. Appl. No. 11/848,891, 11 pages (1588).

* cited by examiner

| EMBODIMENT | FIGURE 1 REFERENCE | WAFER LEVEL COATING PROCESS | | |
|---|---|---|---|---|
| | | ALUMINA THICKNESS ANGSTROMS | SILICA THICKNESS ANGSTROMS | PARYLENE HT THICKNESS ANGSTROMS |
| EMBODIMENT 1 | | | | |
| DIELECTRIC LAYER 1 | 22 | 50-2000 | 0 | 0 |
| DIELECTRIC LAYER 2 | 24 | 0 | 0 | 0 |
| DIELECTRIC LAYER 3 | 26 | 0 | 0 | 0 |
| EMBODIMENT 2 | | | | |
| DIELECTRIC LAYER 1 | 22 | 50-2000 | 0 | 0 |
| DIELECTRIC LAYER 2 | 24 | 50-2000 | 0 | 0 |
| DIELECTRIC LAYER 3 | 26 | 0 | 0 | 0 |
| EMBODIMENT 3 | | | | |
| DIELECTRIC LAYER 1 | 22 | 50-2000 | 0 | 0 |
| DIELECTRIC LAYER 2 | 24 | 50-2000 | 0 | 0 |
| DIELECTRIC LAYER 3 | 26 | 0 | 50-1000 | 0 |
| EMBODIMENT 4 | | | | |
| DIELECTRIC LAYER 1 | 22 | 50-2000 | 0 | 0 |
| DIELECTRIC LAYER 2 | 24 | 50-2000 | 0 | 0 |
| DIELECTRIC LAYER 3 | 26 | 0 | 0 | 200-500 |
| EMBODIMENT 5 | | | | |
| DIELECTRIC LAYER 1 | 22 | 50-2000 | 0 | 0 |
| DIELECTRIC LAYER 2 | 24 | 0 | 0 | 50-2000 |
| DIELECTRIC LAYER 3 | 26 | 0 | 0 | 0 |

| | | WAFER LEVEL COATING | | | ASSEMBLY LEVEL COATING | | |
|---|---|---|---|---|---|---|---|
| EMBODIMENT | FIG 1 REF | ALUMINA THICKNESS ANGSTROMS | SILICA THICKNESS ANGSTROMS | FLUORINATED PARYLENE ANGSTROMS | ALUMINA THICKNESS ANGSTROMS | SILICA THICKNESS ANGSTROMS | FLUORINATED PARYLENE ANGSTROMS |
| EMBODIMENT 1a | | | | | | | |
| DIELECTRIC LAYER 1 | 150 | 50-2000 | 0 | 0 | 0 | 0 | 0 |
| DIELECTRIC LAYER 2 | 156 | | 0 | 0 | 50-2000 | 0 | 0 |
| DIELECTRIC LAYER 3 | 158 | 0 | 0 | 0 | 0 | 0 | 0 |
| EMBODIMENT 1b | | | | | | | |
| DIELECTRIC LAYER 1 | 150 | 50-2000 | 0 | 0 | 0 | 0 | 0 |
| DIELECTRIC LAYER 2 | 156 | | 0 | 0 | 0 | 0 | 50-2000 |
| DIELECTRIC LAYER 3 | 158 | 0 | 0 | 0 | 0 | 0 | 0 |
| EMBODIMENT 1c | | | | | | | |
| DIELECTRIC LAYER 1 | 150 | 50-2000 | 0 | 0 | 0 | 0 | 0 |
| DIELECTRIC LAYER 2 | 156 | | 0 | 0 | 0 | 50-2000 | |
| DIELECTRIC LAYER 3 | 158 | 0 | 0 | 0 | 0 | 0 | 0 |
| EMBODIMENT 1d | | | | | | | |
| DIELECTRIC LAYER 1 | 150 | 50-2000 | 0 | 0 | 0 | 0 | 0 |
| DIELECTRIC LAYER 2 | 156 | 0 | 0 | 0 | 50-2000 | 0 | 0 |
| DIELECTRIC LAYER 3 | 158 | 0 | 0 | 0 | 0 | 0 | 50-2000 |
| EMBODIMENT 1e | | | | | | | |
| DIELECTRIC LAYER 1 | 150 | 50-2000 | 0 | 0 | 0 | | 0 |
| DIELECTRIC LAYER 2 | 156 | | 0 | 0 | 50-2000 | 0 | 0 |
| DIELECTRIC LAYER 3 | 158 | 0 | 0 | 0 | 0 | 50-2000 | 0 |
| EMBODIMENT 2a | | | | | | | |
| DIELECTRIC LAYER 1 | 150 | 50-2000 | | 0 | | 0 | 0 |
| DIELECTRIC LAYER 2 | 156 | 50-2000 | 0 | 0 | 0 | 0 | 0 |
| DIELECTRIC LAYER 3 | 158 | 0 | 0 | 0 | | | 50-2000 |
| EMBODIMENT 2b | | | | | | | |
| DIELECTRIC LAYER 1 | 150 | 50-2000 | 0 | 0 | | 0 | 0 |
| DIELECTRIC LAYER 2 | 156 | 50-2000 | 0 | 0 | | 0 | 0 |
| DIELECTRIC LAYER 3 | 158 | 0 | 0 | 0 | 50-2000 | 0 | |
| EMBODIMENT 2c | | | | | | | |
| DIELECTRIC LAYER 1 | 150 | 50-2000 | 0 | 0 | | 0 | 0 |
| DIELECTRIC LAYER 2 | 156 | 50-2000 | 0 | 0 | | 0 | 0 |
| DIELECTRIC LAYER 3 | 158 | 0 | 0 | 0 | 0 | 50-2000 | |

METHODS OF MAKING AN ENVIRONMENT PROTECTION COATING SYSTEM

RELATED APPLICATIONS

This application is a divisional of application Ser. No. 11/848,891, filed Aug. 31, 2007, entitled Environmental Protection Coating System and Method, which claims the benefit of priority under 35 U.S.C. §119(e) of U.S. Provisional Application Ser. No. 60/888,715, entitled Environmental Protection Coating System and Method, filed Feb. 7, 2007.

TECHNICAL FIELD OF THE DISCLOSURE

This disclosure relates generally to environmental protection coatings, and more particularly, to an environmental protection coating system and method of manufacturing the same.

BACKGROUND OF THE DISCLOSURE

Circuit devices having electrical components that are integrally formed on a substrate and circuit board assemblies comprised of active and passive devices have enjoyed wide acceptance due to the wide variety of uses they may provide. Uses for these circuit devices and circuit board assemblies may include applications where operation in a protected environment is not readily available, is costly and/or limits system performance. For such applications, passivation techniques may be employed such that the electrical performance of the components are improved and the components of the circuit device may be protected against harmful contaminants such as moisture, humidity, particulates, or ionic impurities, such as those produced from sodium or chlorine based gases, elements or compounds. Such techniques enable the elimination of costly hermetic enclosures or packages and allow circuit functions to be packaged in closer proximity, thus enabling higher packaging densities, lower weights and higher frequency performance. Additionally, circuit board assemblies using tin metallization are prone to the formation of tin whiskers that may be aggravated by humidity and metallization stress. Conventional conformal coatings based solely on polymer materials have had limited success.

SUMMARY OF THE DISCLOSURE

According to one embodiment of the disclosure, a method includes providing a circuit board having an outer surface, the outer surface configured with a plurality of discrete electrical components that are each manufactured independently of one another, and coating the outer surface and the plurality of discrete electrical components with a first protective dielectric layer. The method further includes coating the first protective dielectric layer with a second dielectric layer. The second dielectric layer includes a dielectric material having a modulus of elasticity less than 3.5 Giga-Pascal (GPa), a dielectric constant less than 2.7, a dielectric loss less than 0.002, a breakdown voltage strength in excess of 2 million volts/centimeter (MV/cm), a temperature stability to 300° Celsius, a defect densities less than 0.5/centimeter, a pinhole free in films greater than 50 Angstroms, and is capable of being deposited conformally over and under 3D structures with thickness uniformity less than or equal to 10%.

Embodiments of the disclosure may provide numerous technical advantages. Some, none, or all embodiments may benefit from the below described advantages. According to one embodiment, an environmental protection coating system may be provided for discrete electrical components or other assembly level features of a circuit board assembly during the assembly level phase of production. These discrete electrical components or other assembly level features may render the circuit board assembly susceptible to moisture attack, particulates or other contaminants. The environmental protection coating system of the present disclosure includes a dielectric layer made of a dielectric material that may be applied in a relatively consistent thickness to protect the discrete electrical components or other assembly level features from moisture or other harmful contaminants with relatively little impact on circuit performance.

Other technical advantages will be apparent to one of skill in the art.

BRIEF DESCRIPTION OF THE DRAWINGS

A more complete understanding of embodiments of the disclosure will be apparent from the detailed description taken in conjunction with the accompanying drawings in which.

DETAILED DESCRIPTION OF EXAMPLE EMBODIMENTS OF THE DISCLOSURE

Figure 1:
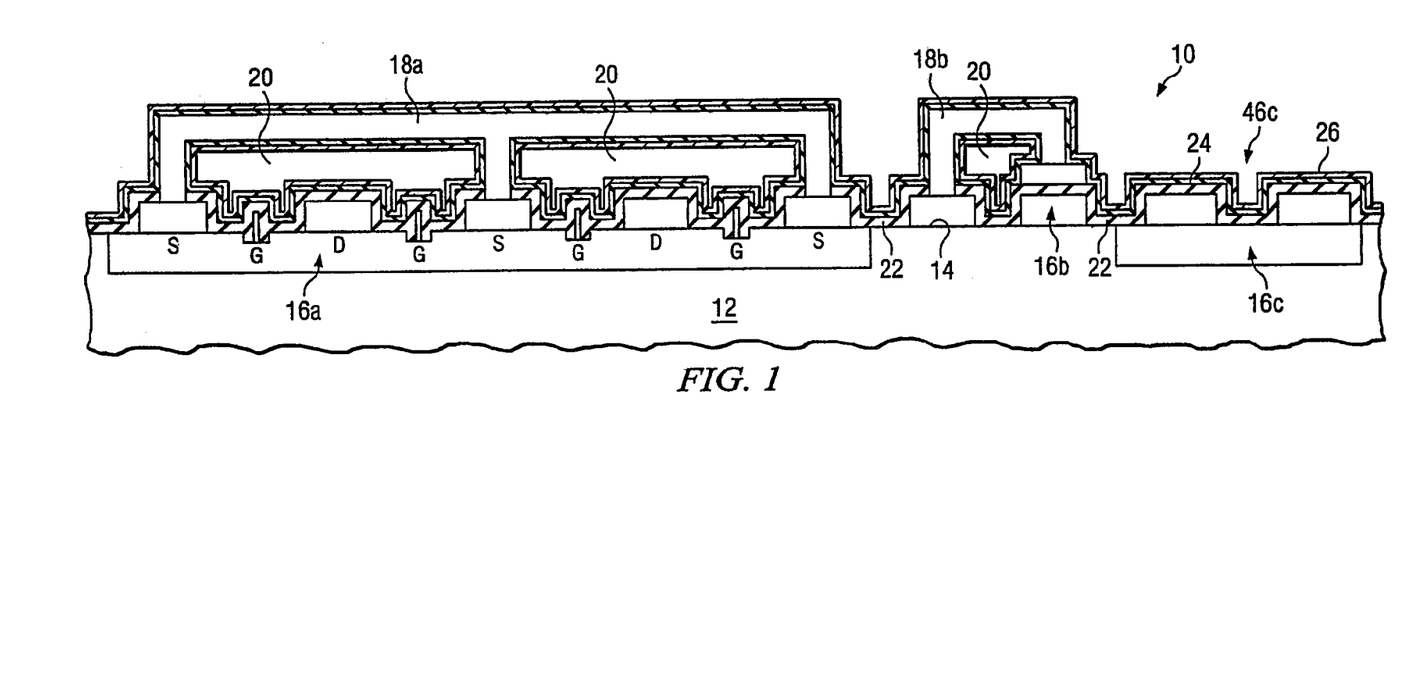
FIG. 1 is a side elevational view of one embodiment of an integrated circuit device incorporating a passivation system according to the teachings of the present disclosure.

Referring to the drawings, FIG. 1 shows one embodiment of a circuit device 10 constructed according to the teachings of the present disclosure. Circuit device 10 generally includes a substrate 12 having a substrate surface 14 on which several electrical components 16 are integrally formed. Substrate 12 of FIG. 1 may be formed from any semi-conductor material suitable for the manufacture of circuit devices 10, which may be, for example, silicon (Si), gallium-arsenide (GaAs), Gallium-Nitride (GaN), germanium (Ge), silicon-carbide (SiC), or indium-phosphide (InP). Each of these types of materials may be provided in a generally planar-shaped surface 14 on which electrical components 16 may be formed.

Electrical components 16 may include any component that may be formed on substrate surface 14 that may be, for example, transistors, capacitors, resistors, inductors, and the like. In the particular embodiment shown, electrical components 16 may be several transistors 16a, a capacitor 16b, and a resistor 16c; however, circuit device 10 may include other types of electrical components without departing form the teachings of the disclosure. In one embodiment, transistors 16a may be a pseudomorphic high electron mobility transistor (PHEMT) device having a source region S, gate region G, and a drain region D, respectively. An air bridge 18a is illustrated joining the source regions S of each of the transistors 16a. Another air bridge 18b is provided for electrical connection of capacitor 16b. Air bridges 18a and 18b may be referred to herein as additional components 18. Additional components 18 may refer to any suitable component that overlies components 16 for various purposes, such as but not limited to, electrical connection of components 16, heat conduction, and/or structural reinforcement.

Overlying the substrate surface 14 and electrical components 16, is a first protective dielectric layer 22, a second protective dielectric layer 24, and a third dielectric layer 26. As described in greater detail below, the first protective dielectric layer 22, second protective dielectric layer 24, and third dielectric layer 26 are operable to passivate the substrate 12 and components 16 and 18 from various harmful charge traps and contaminants such as moisture, humidity, particulates, corrosive materials, and ionic impurities, such as sodium, potassium, or chlorine.

Known implementations of circuit devices have provided for passivation of electrical components from harmful contaminants using a dielectric layer that is disposed directly on the electrical components and substrate surface. This dielectric layer may have been formed from insulating materials, such as silicon-nitride ($Si_3N_4$) or silicon-dioxide ($SiO_2$). These known dielectric materials suffer, however, in that their ability to prevent moisture degradation is generally less than desirable. Therefore, usage of silicon-nitride material requires application of a relatively thick layer in order to provide adequate protection for the circuit device in an environmentally unprotected or non-hermetic environment. A problem with this approach is that only moderate passivation of the circuit assembly is achieved in spite of the material's relatively large thickness. Additionally, the relatively large thickness may adversely affect the performance of the circuit device due to an increase in the internode capacitance between active regions of the device such as source S, gate G, and drain D regions of transistors. Additionally, the relatively thick layer of silicon-nitride or other conventional dielectric results in high stress which can induce device or dielectric cracking, delamination and/or piezoelectric effects that degrade device performance.

As an alternative to thick silicon-nitride for moisture protection, approaches have been implemented that utilize a second or third passivation layer of a material such as chemical vapor deposition (CVD) of silicon-carbide or atomic layer deposition (ALD) of aluminum-oxide followed by a layer of silicon-dioxide. Use of the additional silicon-carbide or ALD protection layers on top of a first layer of silicon-nitride further increases internode capacitance beyond that associated with the underlying silicon-nitride and thus degrades device performance. Further the silicon-nitride and/or silicon-carbide can still be attacked over time due to their high moisture susceptibility.

It is also known that the first protective dielectric layer, 22, may provide protection of the gate region from charge traps and contamination that can occur in subsequent processing steps. Hence the first protective dielectric layer 22 is applied immediately before and/or immediately after gate fabrication. Consequently subsequent fabrication steps such as the formation of air bridges 18 and RF and DC conductors or interconnections may leave exposed metal lines which may be susceptible to shorting due to particulates, electrochemical or galvanic corrosion. Approaches proposed to address potential corrosion of such exposed metal lines have included chemical vapor deposition of silicon-nitride or silicon-carbide. One problem associated with the conventional chemical vapor deposition process may be line-of-sight deposition with respect to dielectric coverage. Hence regions beneath air bridges may not be adequately coated and may therefore be susceptible to corrosive attack or to the formation of leakage currents in the presence of moisture. Additionally, a second protective dielectric layer of silicon-nitride and/or silicon-carbide may be susceptible to moisture degradation. Use of an atomic layer deposition coating over the silicon-nitride layer would provide conformality on three dimensional surface features but, as noted previously, would also increase internode capacitance and degrade device performance. Certain embodiments, such as high performance microwave and millimeter wave monolithic microwave integrated circuits (MMICs) may not tolerate significant reduction in radio frequency (RF) performance.

In one embodiment of the present disclosure, dielectric layers 22 and 24 may be provided that implement a moisture impermeable material superior to the moisture protective characteristics of known dielectric materials. In particular embodiments, protective dielectric layers 22 and 24 may be provided that implement a moisture impermeable material with superior voltage breakdown characteristics of known dielectric materials. That is, use of materials having relatively high voltage breakdown characteristics may allow formation of protective dielectric layers 22 and 24 that are thinner than conventionally used to achieve similar voltage breakdown performance. Given these characteristics, a layer of dielectric material that is significantly thinner than known passivation systems may be deposited on the electrical components 16, additional components 18, and substrate surface 14 in order to provide passivation from moisture and other contaminants.

In one embodiment, the first protective dielectric layer is made of a generally moisture insoluble material having a moisture permeability less than 0.01 gram/meter$^2$/day, a moisture absorption less than 0.04 percent, a dielectric constant less than 10, a dielectric loss less than 0.005, a breakdown voltage strength greater than 8 million volts/centimeter, and a sheet resistivity greater than $10^{15}$ ohm-centimeter. In a particular embodiment, first protective dielectric layer 22 may be formed of alumina ($Al_2O_3$). Alumina may be deposited in a relatively thin layer in a consistent manner. Alumina also possesses relatively high voltage breakdown characteristics. In another embodiment, first protective dielectric layer 22 may be formed of other materials, such as high density silicon-nitride, tantalum-oxide, beryllium-oxide, and hafnium-oxide.

In a particular embodiment, first protective dielectric layer 22 is formed of alumina and has a thickness in the range of 50 to 2000 angstroms. At this thickness range, the first protective dielectric layer 22 may provide adequate protection of the circuit device 10 from moisture without undue effect on the apparent capacitance of electrical components 16. In one embodiment, the thickness of this layer may be precisely controlled to maintain repeatable performance of many circuit devices 10 that may be constructed according to the various embodiments.

The second protective dielectric layer 24 may be operable to passivate additional components 18. Application of a second protective dielectric layer 24 provides for passivation of additional components 18 that were not passivated by first protective dielectric layer 22. In a particular embodiment in which an additional component 18 is an air bridge, application of the first protective dielectric layer 22 prior to formation of the air bridge provides for relatively concise control over the thickness of first protective dielectric layer 22 that may be confined in an air cavity 20 following formation of the air bridge. Additionally, second protective dielectric layer 24 may provide passivation for portions of the first protective dielectric layer 22 that may be inadvertently damaged by additional processing steps, such as, for example, sawing, scribing moats, or providing interconnections to other devices.

The second protective dielectric layer 24 may be made of the same dielectric material, but in some embodiments may be made of dielectric materials described above with respect to the first protective dielectric layer 22. In other embodiments, the second protective dielectric layer 24 may also be made of any material that is described below with respect to the third dielectric layer 26. In one embodiment, the second protective dielectric layer 24 may have a thickness in the range of 50 to 2000 angstroms. Other particular embodiments are described in greater detail below with respect to FIG. 3.

Figure 5A:
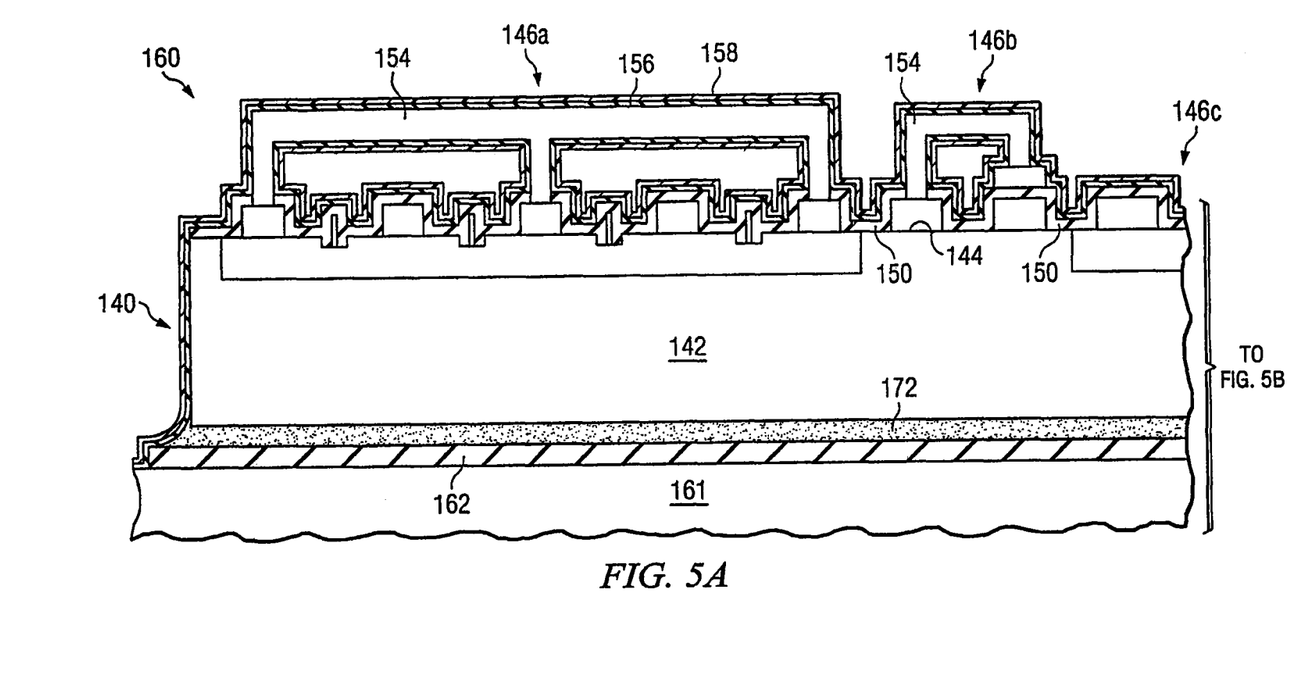
FIGS. 5A and 5B are a cut-away perspective view of one embodiment of a passivation layer system for a circuit assembly of the present disclosure.
Figure 5B:
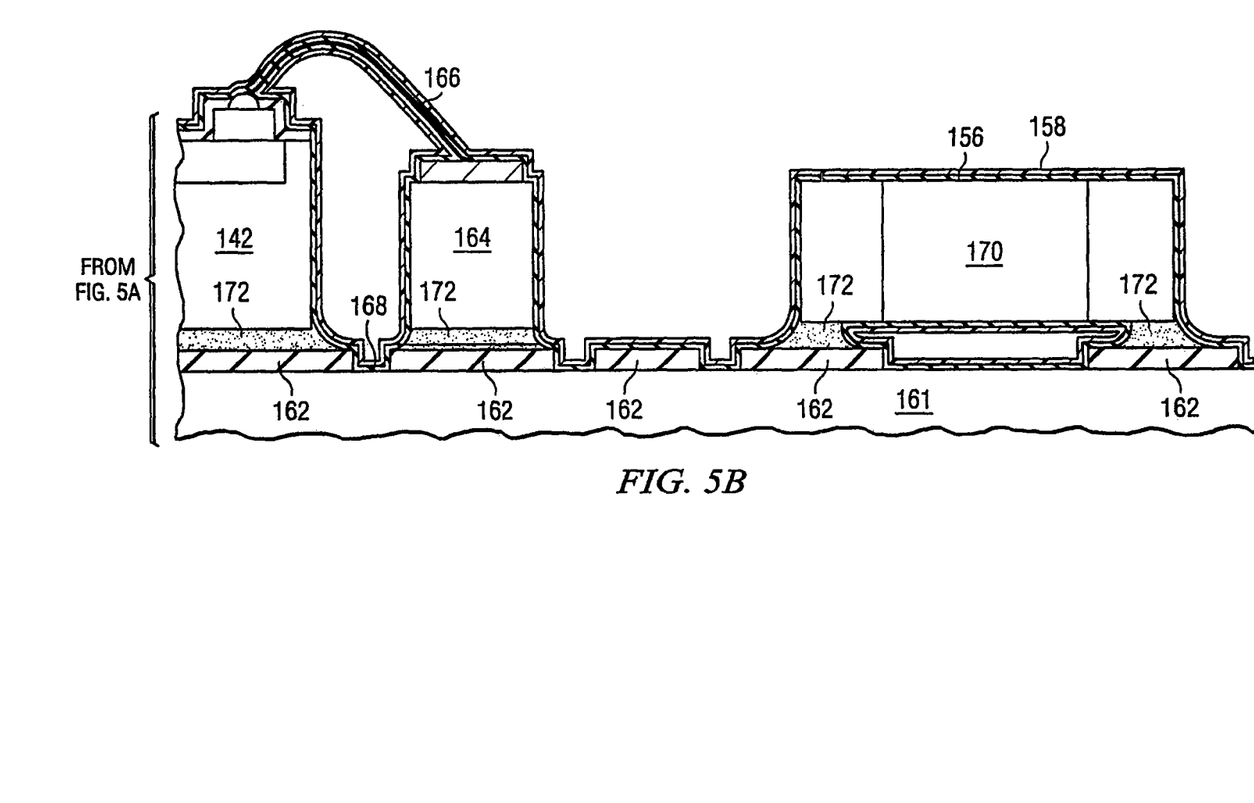

Although alumina may be moisture impermeable, its surface may exhibit chemical attack in the presence of high humidity, low humidity for extended periods and/or condensed moisture. Thus a third dielectric layer 26 may be provided. Third dielectric layer 26 may be formed of any material that is chemically stable in the presence of high humidity, extended humidity, and/or moist condensation and vapor permeation. In one embodiment, third dielectric layer 26 may be formed of silicon-dioxide ($SiO_2$). In another embodiment, third dielectric layer 26 may be formed of parylene. Parylene C, parylene F (poly-tetrafluoro-p-xylene), aromatic-fluorinated VT-4, parylene HT® (trademark of Specialty Coating Systems), or other fluorinated parylene-like films, may retard moisture from reaching first 22 and/or second 24 protective dielectric layers and be used for layer 26. These materials may exhibit superior moisture retarding characteristics and remain functionally stable over a wider temperature range than other types of parylene. These materials may not develop high film stress due to high temperature exposure. These materials may also have a lower dielectric constant than silicon-dioxide. In one embodiment, the third dielectric layer 26 may have a thickness in the range of approximately 100 to 1000 angstroms. Rather than these parylene materials, any material exhibiting the characteristics described below for layers 156 or 158 with respect to FIG. 5 may also be used for third dielectric layer 26.

Thus, passivation for a circuit device 10 may be provided by first protective dielectric layer 22, second protective dielectric layer 24, and an optional third dielectric layer 26. Each of these layers 22, 24, and 26 may be sufficiently thin to not adversely affect the performance characteristics of circuit device 10 while providing adequate protection from gaseous, liquid and solid contaminants including moisture.

Figure 2:
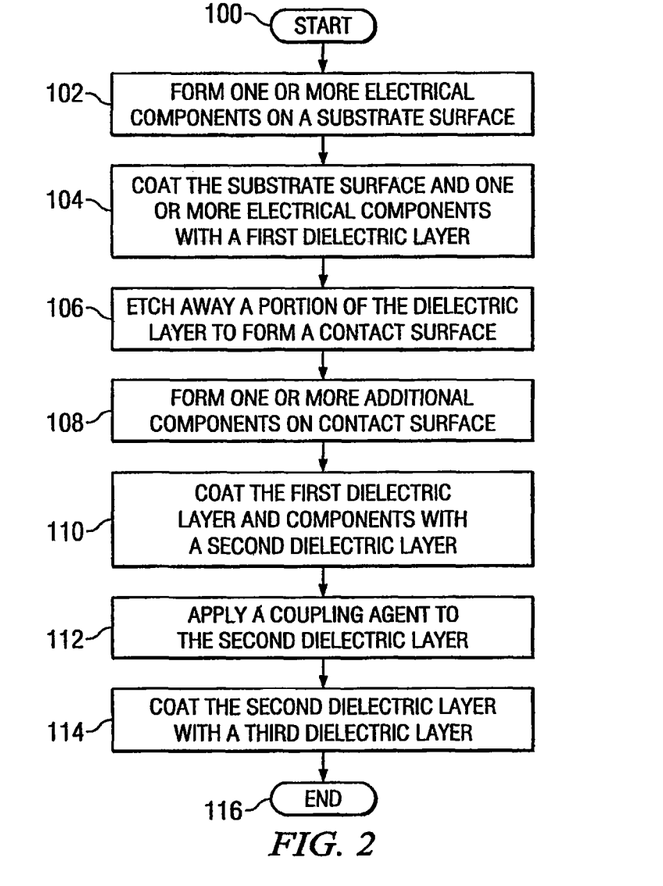
FIG. 2 is a flowchart showing several acts that may be performed in order to manufacture the embodiment of FIG. 1.

FIG. 2 depicts a series of actions that may be performed in order to manufacture one embodiment of a circuit device 10 according to the present disclosure. In act 100, the method for providing an electrical and environmental protection coating system is initiated. In act 102, one or more electrical components 16 may be formed on a substrate surface 14 using known integrated circuit manufacturing techniques. In act 104, a first protective dielectric layer 22 may be deposited on the substrate surface 14 and electrical components 16. In one embodiment, the thickness of the first protective dielectric layer 22 may have a thickness in the range of 50 to 2000 angstroms. First protective dielectric layer 22 may comprise certain materials as described above.

Acts 106 through 110 may provide one approach for forming one or more additional components 18 on the circuit device 10. To provide a contact surface for attachment of additional components 18, selected portions of the first protective dielectric layer 22 may be etched away from the circuit device 10 in act 106. Next in act 108, one or more additional components 18 are formed on these contact surfaces. A second protective dielectric layer 24 may then be deposited over the first protective dielectric layer 22 and any additional components 18 that have been formed on the circuit device 10 in act 110. In one embodiment, the second protective dielectric layer 24 may have a thickness in the range of 50 to 2000 angstroms. Thus, the cumulative thickness of the first 22 and second 24 protective dielectric layers may have a thickness in the range of 100 to 4000 angstroms.

In one embodiment, an adhesion promoter may be applied over the second protective dielectric layer 24 to improve adhesion of the third dielectric layer 26 to the second protective dielectric layer 24 in act 112. In one embodiment, the adhesion promoter may be a layer of silicon dioxide used independently or in conjunction with gamma-methacryloxypropyltrimethoxysilane; however, other adhesion promoters may be used. Third dielectric layer 26 may then be applied to the second protective dielectric layer 24 in act 114. In one embodiment, the thickness of the third dielectric layer 26 may be in the range of 100 to 1000 angstroms.

In act 116, the method for application of a passivation layer has been completed and the circuit device 10 may then be used. Acts 100 through 116 describe one embodiment of a method for manufacture of a circuit device 10 in which the protective dielectric layers 22 and 24 are applied in multiple processing steps. Using this approach, the thickness of first protective dielectric layer 22 adjacent electrical components 16 within air cavity 20 may be easily controlled. By application of first protective dielectric layer 22 prior to forming additional components 18 such as air bridges, the thickness of the first protective dielectric layer 22 proximate electrical components 16 may be easily controlled using a variety of deposition techniques known in industry.

Figure 3:
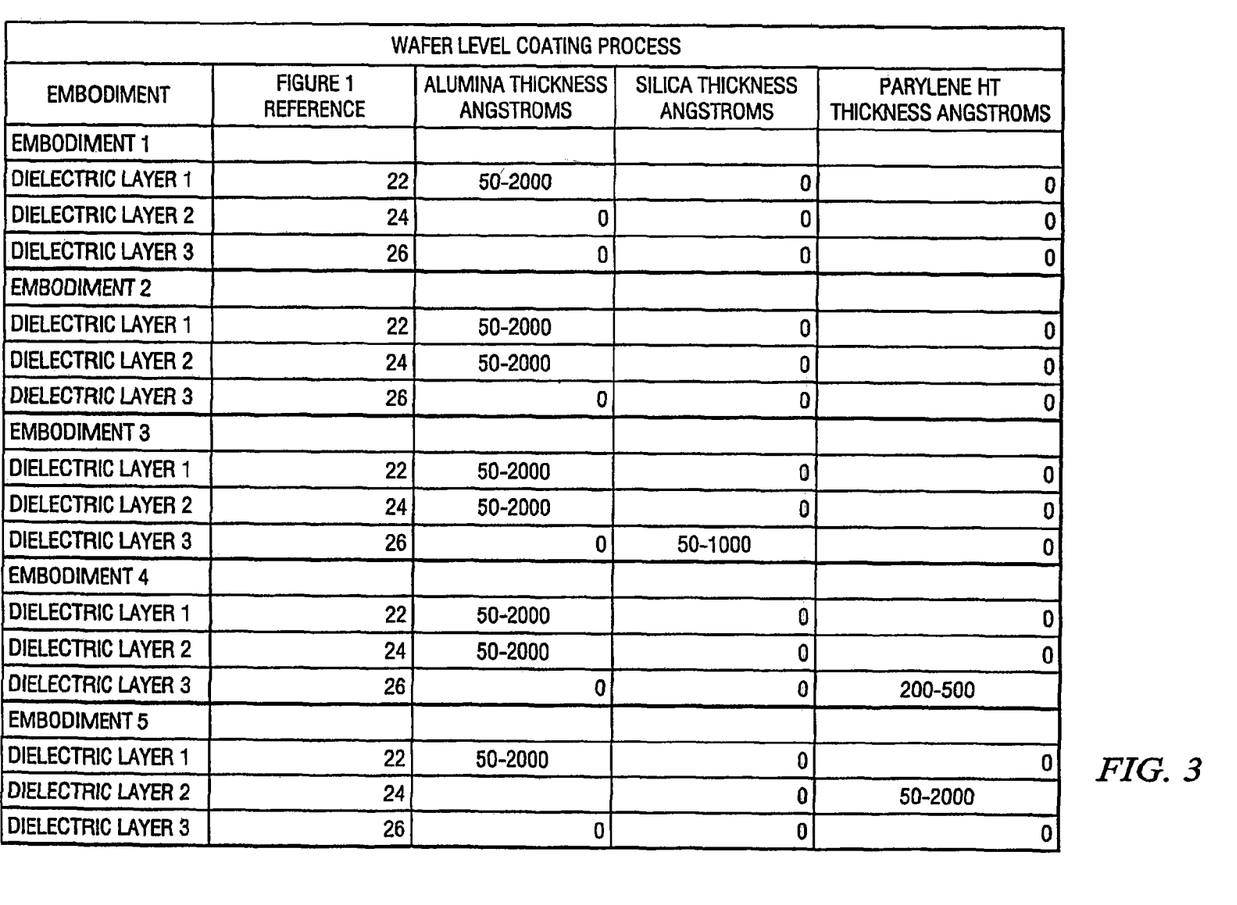
FIG. 3 is a tabular summary of various wafer level embodiments of the present disclosure.

FIG. 3 is a table that summarizes various embodiments 1 through 5 of the present disclosure that may provide enhanced electrical performance and enhanced environmental protection over known passivation systems. Each embodiment 1 through 5 shows various combinations of materials (e.g., alumina, silica, and/or parylene F, aromatic-fluorinated VT-4, parylene HT®, or other fluorinated parylene-like films) that may be used form the first 22, second 24, and/or third 26 dielectric layers.

As described above with respect to FIG. 1, the first protective dielectric layer 22 in embodiments 1 through 5 may be formed of a generally moisture insoluble material having a moisture permeability less than 0.01 gram/meter$^2$/day, a moisture absorption less than 0.04 percent, a dielectric constant less than 10, a dielectric loss less than 0.005, a breakdown voltage strength greater than 8 million volts/centimeter, a sheet resistivity greater than $10^{15}$ ohm-centimeter. In one particular embodiment, first protective dielectric layer 22 is formed of alumina, which has a relatively lower moisture permeability, relatively lower ionic mobility, and relatively higher voltage breakdown strength characteristics than other known materials, such as standard silicon-nitride or silicon-dioxide. The first protective dielectric layer 22 may be deposited by a number of deposition techniques, such as physical vapor deposition (PVD), chemical vapor deposition (CVD) and atomic layer deposition. Atomic level deposition may be used because it may provide relatively precise control of thickness, superior conformality on the substrate surface 14 and components 16 and 18, and elimination of physical or radiation induced damage during dielectric deposition.

As described above with respect to FIG. 1, additional layers of dielectric protection can be added depending on the specific device and/or assembly packaging approach. The thickness of the dielectric layers 22, 24, and 26 may also be a function of device design, frequency of operation and performance requirements. Embodiments 1 through 5 shown in FIGS. 3 may be particularly tailored for radio frequency (RF) integrated circuits that may include components such as field effect transistors (FETs) including pseudomorphic high electron mobility transistor devices (pHEMTs) and bipolar transistors such as heterojunction bipolar transistors (HBTs). In general, a relatively lower dielectric thickness improves device performance associated with dielectric loading effects such as internode capacitance, increases capacitance per unit area of integrated capacitors and thereby decreases capacitor size. A relatively higher dielectric thickness decreases moisture permeability and improves protection against particulates, physically induced damage, ionic impurities, and corrosive contaminants whether in solid, liquid or gaseous form. The thicknesses of dielectric layers 22, 24, and 26 shown in FIGS. 3 may be tailored for radio frequency (RF) integrated circuits where control of internode capacitance and control of dielectric loading effects are important to circuit performance. Other combinations of materials and thicknesses may be selected according to the teachings of this disclosure.

Embodiment 1 of FIG. 3 utilizes only a first protective dielectric layer 22 made of alumina. Embodiment 1 may provide enhanced electrical performance due to minimal internode capacitance of a single dielectric layer while providing electrical, physical and environmental protection of the source region S, gate region G, and drain region D of transistor 16a of FIG. 1. Embodiment 1 may also provide enhanced electrical performance over known materials, such as silicon-nitride or silicon-dioxide in both hermetic and non-hermetic environments. Enhanced performance may be provided since a thinner dielectric than conventional silicon-nitride or silicon-dioxide can be utilized. Embodiment 1 may also be desirable in environments where partial control of temperature and or humidity is provided at the system level such that conditions are provided that minimize or eliminate water condensation on active circuitry and/or minimize or eliminate high temperature and humidity exposure of active circuitry for prolonged periods of time. Such protection may be achieved at the system level by humidification control through dehumidifiers or desiccants.

Embodiment 2 provides first 22 and second 24 protective dielectric layers formed of alumina. The second protective dielectric layer 24 covers unprotected additional components 18 such as air bridges and thick metal lines, which may be formed after the first protective dielectric layer 22 is applied. Embodiment 2 may also be desirable in hermetic or less severe humidity environments where protection against conductive or corrosive solid, liquid or gases materials may be present.

Embodiments 3 and 4 provide a third dielectric layer 26 that may be formed of silica or parylene F, parylene HT®, or other fluorinated parylene-like film as described above. The third dielectric layer 26 formed of silica or parylene F, parylene HT®, or other fluorinated parylene-like films protects the first 22 and/or second 24 protective dielectric layers from high humidity, extended humidity and/or condensed moisture which may break down the first 22 and/or second 24 protective dielectric layers 24 and expose the underlying components 16 and 18. Parylene F or parylene HT® may have a lower dielectric constant than silica and may therefore have less impact on electrical performance. Parylene F or parylene HT®, like ALD deposited silica, can be vapor deposited and is highly conformal penetrating into the smallest recesses and may be applied with a relative uniform thickness beneath air bridges and other additional components 18 having high aspect ratio recesses. The first 22 and/or second 24 protective dielectric layers made of alumina may also serve as an adhesion promoter since parylene F or parylene HT® may not adhere well to many surfaces even with an adhesion promoter. As described above, an adhesion promoter may be applied to the second protective dielectric layer 24 prior to deposition of the third dielectric layer 26. The adhesion promoter may be any suitable material that enhances adhesion of the third dielectric layer 26, and in one particular embodiment is a layer of silicon dioxide used independently or in conjunction with gamma-methacryloxypropyltrimethoxysilane. Silicon dioxide provides an ideal surface for bonding to adhesion promoters such as gamma-methacryloxypropyltrimethoxysilane and bonds well to alumina and to parylene F or parylene HT®.

Embodiment 5 utilizes parylene F or parylene HT® as the second protective dielectric layer 24 of FIG. 1. Parylene F or parylene HT® covers unprotected additional features, such as air bridges and thick metal lines that may be formed after the first protective dielectric layer 22. The parylene F or parylene HT® also protects the underlying first protective dielectric layer 22 from being dissolved or attacked by moisture condensation. Parylene F or parylene HT® has the advantage of having a lower dielectric constant compared to silica or other inorganic materials and lower than most organic materials.

Figure 4A:
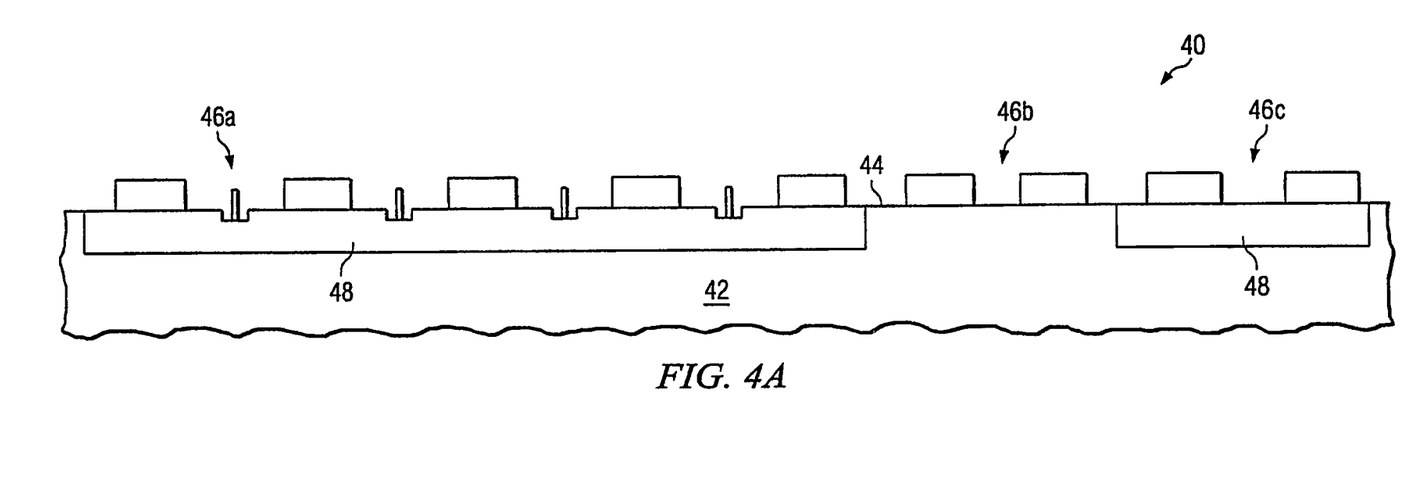
FIGS. 4A through 4D are side elevational views shown during various phases of manufacture of the circuit device of FIG. 1 that may be manufactured according to the teachings of the disclosure.

FIGS. 4A through 4D are cross-sectional drawings shown during various phases of manufacture of a circuit device 40 according to the teachings of the present disclosure. Circuit device 40 is generally analogous to circuit device 10 in FIG. 1. In FIG. 4A, a substrate 42 having a substrate surface 44 is shown with gate recess and gate metal applied for a number of transistor fingers 46a, cap bottom applied for a capacitor 46b, and a resistor 46c. Isolation implant has previously been accomplished to form isolated active channel regions 48 for the transistors 46a and resistor 46c. As described above in conjunction with FIG. 1, in one embodiment, transistors 46a may be pseudomorphic high electron mobility transistors (pHEMTs). The electrical components 46 and associated substrate 42 of FIG. 4A may be manufactured according to act 100 of FIG. 2.

Figure 4B:
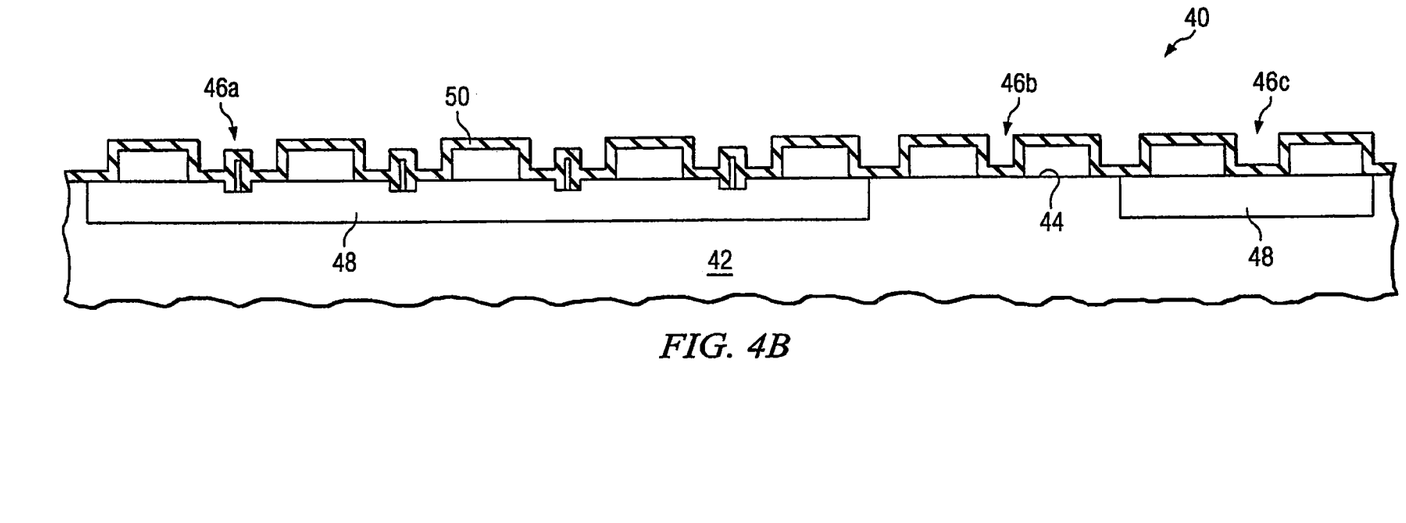

FIG. 4B shows the circuit device 40 of FIG. 4A in which a first protective dielectric layer 50 has been applied according to act 104. As can be seen, each electrical component 46 may be exposed to a generally line-of-sight deposition, thus allowing uniform thickness deposition of the first protective dielectric layer 50. That is, accesses to features of the electrical components are not generally encumbered by additional devices such as air bridges 54.

Figure 4C:
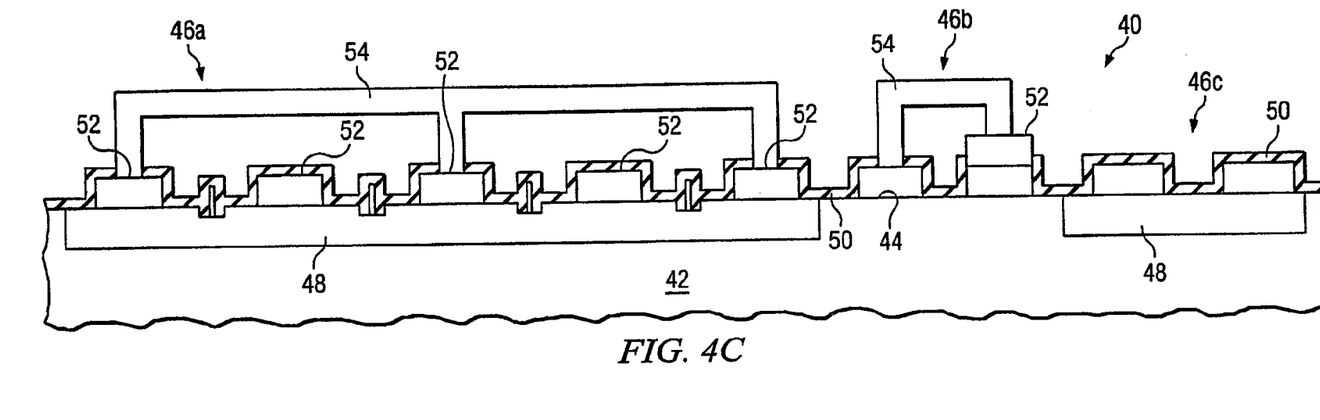

FIG. 4C shows the results of a circuit device 40 on which acts 104 through 108 are performed on the circuit device 40 of FIG. 4B. Contact surfaces 52 have been created by etching away a portion of the first protective dielectric layer 50 for attachment of additional components 54 such as air bridges. The air bridges may be used to make parallel connection to the source transistor fingers 46a and thereby increase output power and to make connection to the top plate of the capacitor 46b.

Figure 4D:
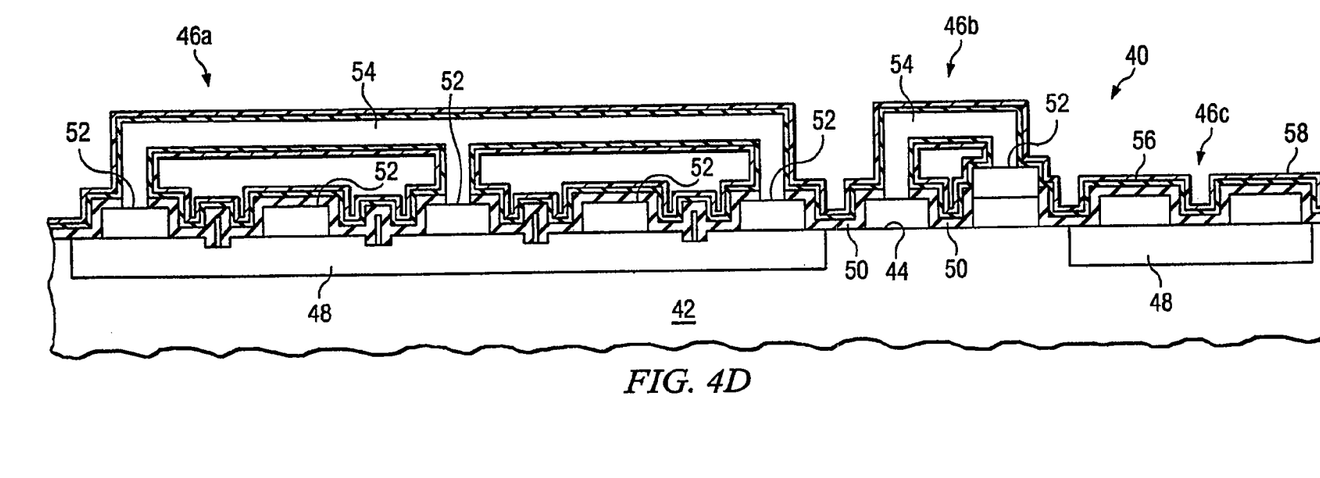

FIG. 4D shows the circuit device 40 of FIG. 4C in which a second protective dielectric layer 56 and third dielectric layer 58 has been applied in order to passivate the substrate surface 44, electrical components 46, and additional components 54 according to act 110 through act 114. Thus, a system and method is provided whereby a circuit device 40 having additional components 54 may be effectively sealed from harmful contaminants while not sacrificing performance of the circuit device 40.

FIGS. 5A and 5B show one embodiment of a circuit board assembly 160 that may be passivated according to another embodiment of the teachings of the present disclosure. Circuit board assembly 160 generally includes a circuit device 140 and several discrete electrical components 164 and 170 that are attached to a circuit board 161. Circuit board assembly 160 may also have several assembly level features including board traces 162 and wire interconnections 166 that provide electrical interconnection between circuit device 140 and electrical components 164 and 170. Overlying the circuit board assembly 160 is a second protective dielectric layer 156 and a third protective dielectric layer 158. Circuit device 140 has a first dielectric layer 150 that was applied during device fabrication, prior to assembly on the circuit board. As will be described below, passivation may be provided at the assembly level of production for protection of circuit device 140 and electrical components 164 and 170 of the circuit board assembly 160 by applying the second protective dielectric layer 156 and/or the third dielectric layer 158 during the assembly level phase of production.

Circuit board 161 may be any suitable device in which a number of discrete electrical components 164 and 170 may be configured on. Generally, circuit board 161 may be a rigid or flexible substrate in structure for securing discrete electrical components 164 and 170 in a fixed physical relationship relative to one another. In one embodiment, circuit board 161 has a generally planar-shaped outer surface 168 on which the discrete electrical components 164 and 170 and circuit device 142 may be attached using an adhesive 172, such as an isotropically conductive adhesive, or with solder. Circuit board 161 may also have board traces 162 formed of conductive material for interconnecting particular discrete electrical components 164 and 170 to one another and/or to the circuit device 140. The circuit device 140 may be analogous to circuit devices 10 and 40 of FIG. 1 and FIGS. 4A through 4D, respectively.

Discrete electrical components 164 and 170 refer to electrical components that are manufactured independently of one another. That is, each discrete electrical component 164 or 170 may be manufactured on a substrate according to a particular process that may be different from other discrete electrical components configured on the circuit board assembly 160. Examples of discrete electrical components include, but are not limited to, resistors, capacitors, inductors, diodes, transistors, and the like.

The circuit device 140 and discrete electrical components 164 and 170 may be electrically coupled together on the circuit board 161 using board traces 162 and/or interconnections 166 for producing any desirable effect. The circuit device 140 and discrete electrical components 164 and 170 may be configured on the circuit board 161 during the assembly level phase of production. The circuit device 140 may be coated with a first 150 and/or second 156 protective dielectric layers as described above with respect to the first 22 and/or second 24 protective dielectric layers, respectively, of FIG. 1.

In many cases, additional processing techniques of circuit device 140 may be desirable following manufacture at the wafer level. For example, the circuit device 140 may be severed from the wafer using saws or other cutting tools in which scribe moats may be created. Interconnections 166 from the circuit device 140 to component 164 may be formed at the assembly level that may be susceptible to harmful contaminants, such as those described above. Thus, the lack of dielectric protection in the scribe moats, device edges and interconnections 166 may render the circuit device 140 susceptible to moisture attack, particulates or other contaminants.

The circuit board 161 may also require environmental protection to perform reliably in a non-hermetic enclosure and/or one where physical particulates cannot be adequately controlled. Known passivation systems use a relatively thick layer of parylene C, D or N that may have a thickness, for example, of 10 microns (100,000 Angstroms) or greater in thickness. This relatively thick layer of parylene may be unsatisfactory for microwave and millimeter wave circuits where the dielectric loading may alter and/or degrade circuit performance. Parylene C, D, or N may not tolerate high temperatures well. Exposures to high temperatures, which may occur on high power devices, may increase the crystallinity of parylene C, D or N. Increases in crystallinity increase stress in the parylene film and at the parylene interface to circuit board assembly 160. Such increases in stress can cause de-lamination of the parylene material resulting in failure or degradation in performance.

One embodiment of the present disclosure provides for application of a second protective dielectric layer 156 and/or third dielectric layer 158 at the assembly level as opposed to the wafer level phase of production. By combining the wafer level coating with the assembly level coating, assembly level features, such as discrete electrical components 164 and 170, circuit device 140, board traces 162, metal interconnections 166, scribe moats, die edges, and external interconnections to the circuit board assembly 160, such as wire or ribbon bonds, and other assembled components can all be coated simultaneously. Further, the required dielectric thickness using certain embodiments of the present disclosure may be, in many instances, two orders of magnitude or more lower than known passivation systems using parylene, silicone, or urethane coatings. This reduced thickness may thus minimize degradation in circuit performance in certain embodiments.

According to one embodiment, the second 156 and/or third 158 protective dielectric layers may be coated with a dielectric material having modulus of elasticity less than 3.5 Giga-Pascal (GPa), dielectric constant less than 2.7, dielectric loss less than 0.008, breakdown voltage strength in excess of 2 million volts/centimeter (MV/cm), temperature stability to 300° Celsius, pinhole free in films greater than 50 Angstroms, hydrophobic with a wetting angle greater than 45 degrees, and capable of being deposited conformally over and under 3D structures with thickness uniformity less than or equal to 30%. This dielectric material may be applied during the assembly level phase of production to passivate the circuit board 161, board traces 162, circuit device 140, discrete electrical components 164 and 170, and assembly level features from the environment. This dielectric material may be applied as the second protective dielectric layer 156 or third dielectric layer 158. The dielectric material is generally chemically stable with respect to vapor or liquid water, thus protecting the first protective dielectric layer 150 and/or second protective dielectric layer 156. The dielectric material has superior moisture retarding characteristics and is functionally stable over a wider temperature range than other known passivation materials described above. The dielectric material also has a lower intrinsic dielectric constant than other known passivation materials. In one embodiment, the third dielectric layer 26 may have a thickness in the range of approximately 100 to 1000 angstroms. In one embodiment, the dielectric material is parylene F, aromatic-fluorinated VT-4, parylene HT®, or other fluorinated parylene-like film.

The coating materials of this embodiment may tolerate higher temperatures than known passivation systems using parylene C, D or N and thus may not degrade as rapidly with exposure to temperature extremes. The additional assembly level dielectric layer(s) may also add further protection to the active device regions. By proper selection of the first protective dielectric layer 150 thickness applied at the wafer level of production in conjunction with the second protective dielectric layer 156 and/or third dielectric layer 158 applied at the assembly level of production, passivation of the circuit board assembly 160 may be tailored to suit many types of applications.

Additionally, the first protective dielectric layer 150 formed of alumina, tantalum-oxide, beryllium-oxide, hafnium-oxide, or high density silicon-nitride, and nanolaminates of these materials with silicon dioxide whereby the dielectric constant is adjusted by controlling the thickness of the nanolaminate layers or other suitable material according to the teachings of this disclosure, may be able to retard growth of tin whiskers, which is an inherent problem associated with the use of tin metallization especially in conjunction with low-lead solder formulations. Tin whisker growth has been associated with the presence of moisture and compressive stress in the tin metallization.

Figure 6:
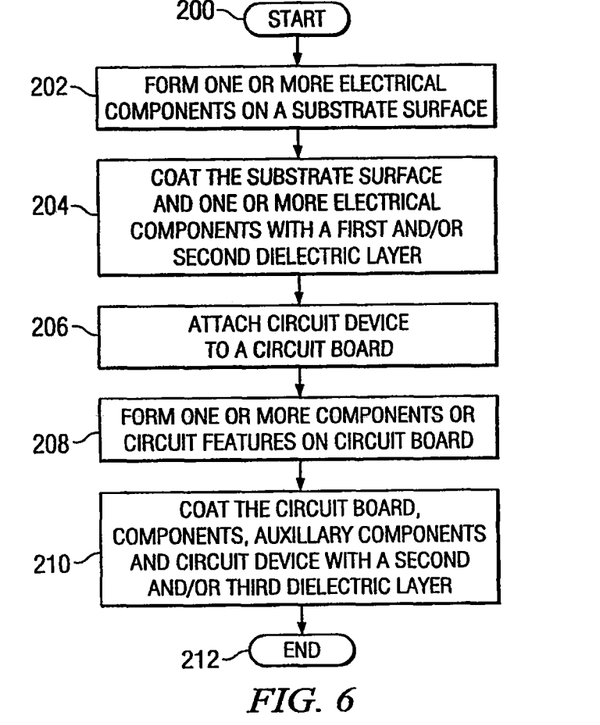
FIG. 6 is a flowchart showing several acts that may be performed in order to manufacture the embodiment of FIGS. 5A and 5B.

FIG. 6 illustrates a series of actions that may be performed in order to manufacture one embodiment of a circuit device 160, shown and described above with respect to FIG. 5. In act 200, the method for providing an electrical and environmental protection coating system is initiated. In act 202, one or more electrical components 146 may be formed on a substrate 142 using known integrated circuit manufacturing techniques. In act 204, first 150 and/or second 156 protective dielectric layers may be deposited on the substrate 142 and electrical components 146. Acts 202 and 204 described actions that may be performed during the wafer level phase of production.

Acts 206 through 214 describe actions that may be performed during the assembly level phase of production. In act 206, the circuit device 142 may be attached to a circuit board 161. In act 208, one or more discrete electrical components 164 and/or 170, and/or one or more assembly level features, such as interconnections 166 may be formed on the circuit board 161. Additionally, other circuit features, such as scribe moats or die edges may be formed on the circuit device 140.

In act 210, a second protective dielectric layer 156 and/or a third dielectric layer 158 may then be deposited over the first 150 and/or second 156 protective dielectric layers, respectively, and any discrete electrical components or assembly level features that have been formed on the circuit board assembly 160. In one embodiment, the second protective dielectric layer 156 or third dielectric layer 158 may be made of a dielectric material, and in a particular embodiment, may be parylene F or parylene HT®. In one particular embodiment in which the second protective dielectric layer 156 and/ or a third dielectric layer 158 is made of parylene F or parylene HT® and is adjacent an underlying layer made of alumina, an adhesion promoter may be applied between the second protective dielectric layer 156 and third dielectric layer 158. In another embodiment, the adhesion promoter may be a layer of silicon dioxide used independently or in conjunction with gamma-methacryloxypropyltrimethoxysilane.

In act 212, the method for application of a passivation layer has been completed and thus the circuit board assembly 160 may then be used.

Figure 7:
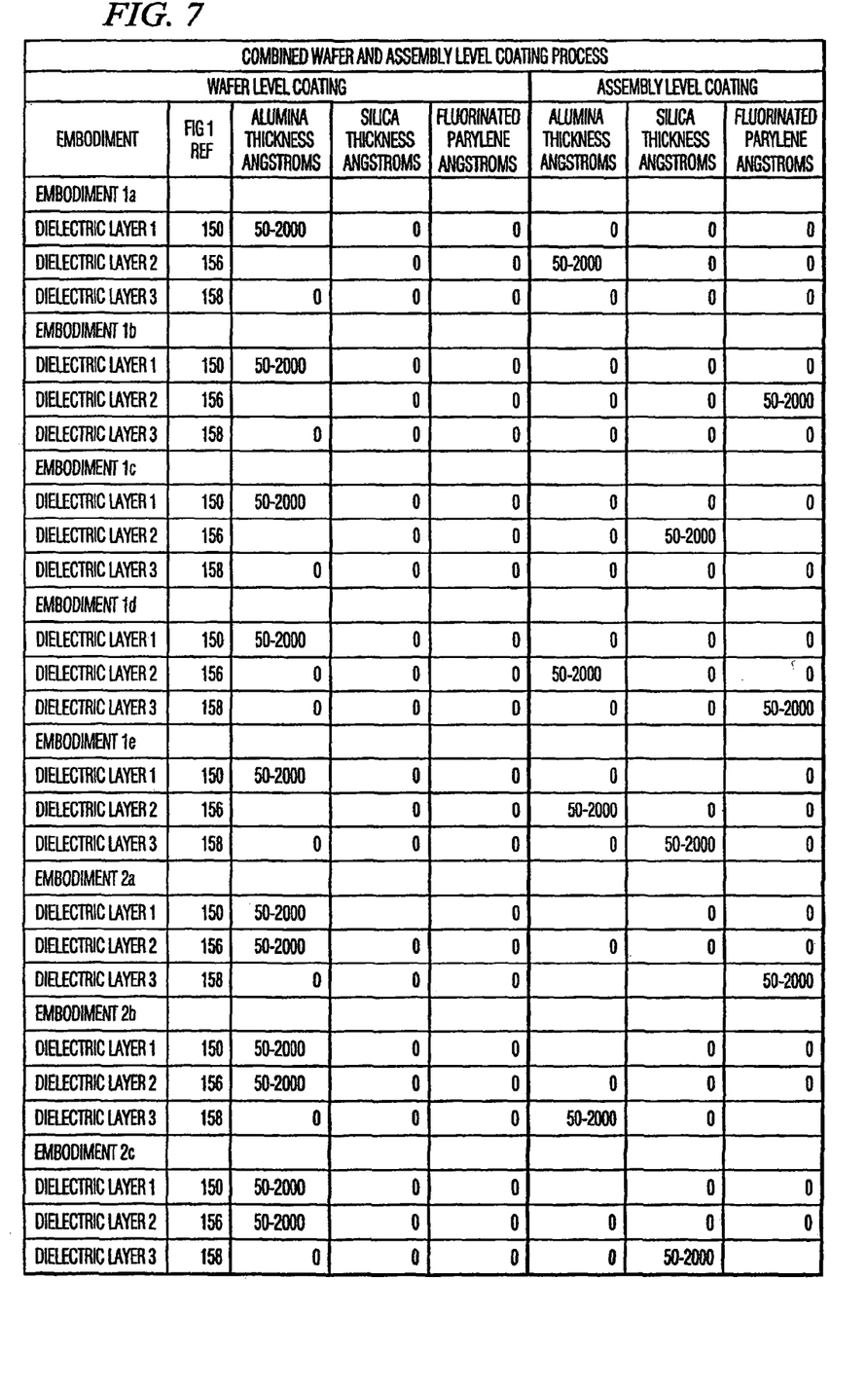
FIG. 7 is a tabular summary of certain assembly level embodiments of the present disclosure.

FIG. 7 shows a number of embodiments 1a through 2c in which various combinations of first protective dielectric layer 150, a second protective dielectric layer 156, and a third dielectric layer 158 that may be applied at the wafer level and at the assembly level phase of production. Embodiments 1a through 2c utilize a first protective dielectric layer 150 that is formed during the wafer level phase of production. As described above with respect to FIG. 3, the material and method of application of the first protective dielectric layer 150 is similar to embodiments 1 through 5 of FIG. 3.

Embodiments 1a, 1b, 1c, 1d, 1e of FIG. 7 have the second protective dielectric layer 156 deposited at the assembly level and hence the second protective dielectric layer 156 may provide protection for assembly level features that are added or modified during the assembly level of production. Examples of assembly level features that may be added or modified at the assembly level include processing of the substrate 142, addition of circuit board components 164 and 170, and forming interconnections 166.

Embodiment 1a shows second protective dielectric layer 156 made of alumina. Application of the second protective dielectric layer 156 at the assembly level may provide enhanced environmental protection compared to known organic dielectrics and hence may minimize dielectric loading effects on components added at the assembly level. Such effects become increasingly important as the frequency of operation increases to microwave and millimeter wave frequencies.

Embodiment 1b utilizes a second protective dielectric layer 156 made of parylene F or parylene HT® with no third dielectric layer 158. In this particular embodiment, an adhesion promoter may be applied prior to application of the second protective dielectric layer 156. Embodiment 1b may provide relatively little electrical impact to the operation of the circuit board assembly 160 due to the low dielectric constant of parylene F or parylene HT®. Embodiment 1c utilizes a second protective dielectric layer 156 made of silica with no third dielectric layer 158.

Embodiment 1d utilizes a second protective dielectric layer 156 of alumina with a third dielectric layer 158 made of parylene F or parylene HT®. As described previously, the alumina layer provides relatively good adhesion to circuit assembly 160 and to parylene F or parylene HT® especially when used in conjunction with an adhesion promoter such as a layer of silicon dioxide used independently or in conjunction with gamma-methacryloxypropyltrimethoxysilane.

Embodiments 2a, 2b, 2c, have first protective dielectric layer 150 and second protective dielectric layer 156 applied at the wafer level and the third dielectric layer 158 applied at the assembly level of production. Certain embodiments using this process may provide an advantage in that the devices may be electrically measured at the wafer level and only known good die provided to the assembly level.

Another embodiment of the present disclosure includes a relatively thin initial layer of high density (greater than 2.5 gm/cm3) and/or low hydrogen content (less than 15 atomic percent) silicon-nitride or silicon dioxide films deposited by techniques well known in the industry including conventional chemical vapor deposition (CVD), High Density plasma enhanced CVD techniques including deposition by Electron Cyclotron Resonance Plasma Enhanced CVD (ECR PECVD), Inductively Coupled Plasma Enhanced CVD (ICPECVD), high density inductively coupled plasma chemical vapor deposition (HDICPCVD), reactive magnetron sputtering, hot wire chemical vapor deposition or PECVD using hydrogen free precursor gases. High density and/or low hydrogen content silicon-nitride may have inherently higher breakdown voltage and resistance to water permeation. The selection of conventional chemical vapor deposition or high density plasma chemical vapor deposition techniques may be based upon the device structure of the circuit board assembly. This initial layer, made of silicon-nitride or silicon-dioxide, has been well developed and characterized in industry to reduce charge traps and other surface interface defects. The thicker first protective dielectric layer deposited over the initial silicon-nitride or silicon dioxide layer would provide the improved performance and protection benefits described above. An example of this embodiment is illustrated in FIG. 8.

Figure 8:
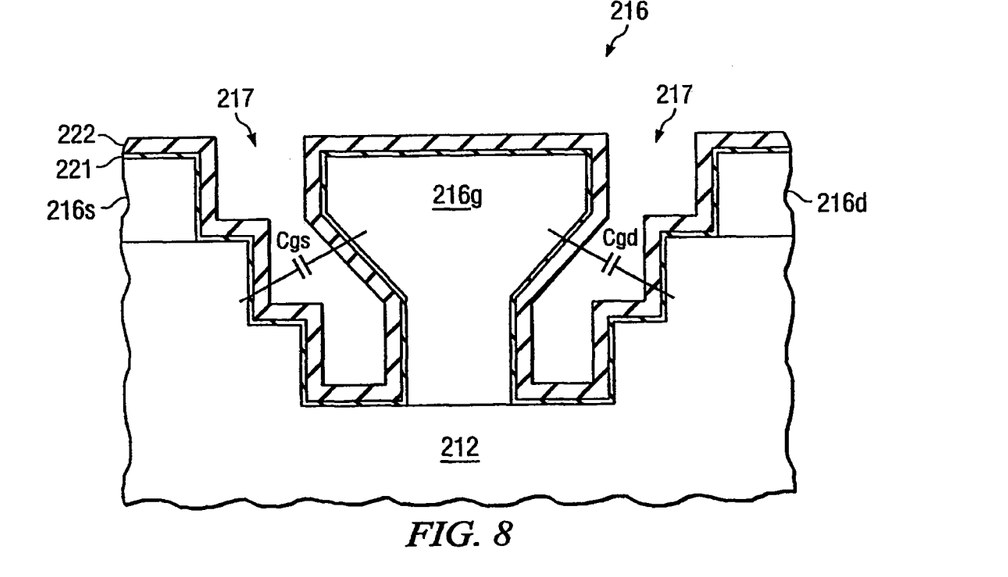
FIG. 8 is an enlarged, partial view of a transistor having a passivation system according to another embodiment of the invention.

FIG. 8 is an enlarged view showing a component 216, which in this particular case is a field effect transistor (FET). Component 216 has a source 216s, a gate 216g, and a drain 216d that are separated from each other by air gap 217. To achieve superior performance, the air gap 217 is maintained by design of gate recess and gate geometry in conjunction with protective dielectric layer 222 and a thin initial layer 221 of silicon-nitride. As can be seen, the combined thicknesses of the first protective dielectric layer 222 and thin initial layer 221 maintain air gaps 17 such that internode capacitance Cgs and Cgd may be reduced. In one particular embodiment this passivation layer includes a thin layer 221 of silicon-nitride in the range of 25 to 400 Angstroms and a low permeability layer 222 of amorphous alumina having a thickness in the range of 50 to 2000 Angstrom. First dielectric layer 222 may also be formed of any of the same materials as first protective dielectric layer 22, described above.

Silicon-nitride has proven to be a relatively good and well characterized dielectric for microwave devices with respect to device stability. Alumina has also shown to be a relatively good dielectric with respect to moisture permeability and breakdown voltage. The combination of these two materials with the appropriate thickness and physical properties described in this disclosure may result in an enhanced passivation system over known passivation systems. In one embodiment, a thin layer of silicon-nitride may be used with a nanolaminate. The nanolaminate may include alternate layers of alumina and silicon-dioxide, alumina and parylene F, aromatic-fluorinated VT-4, parylene HT® or other fluorinated parylene-like film, or alumina and acrylic. In another embodiment, the nanolaminate may include alternate layers of alumina and vapor deposited Teflon (PFTE) and acrylic monomers.

Silicon-nitride, silicon dioxide and alumina have low dielectric constants, especially when deposited under relatively low temperature conditions and with atomic layer deposition. The low dielectric constant further minimizes internode capacitance, changes in performance between coated and uncoated devices and results in improvement in high frequency performance.

Other materials may be substituted for those shown in FIGS. 1-8 according to the teachings of the present disclosure. Other protective dielectric materials that may be suited for such applications may include but are not limited to standard density silicon-nitride, high density silicon-nitride, tantalum-oxide, and beryllium-oxide, hafnium-oxide.

Further improvements in environmental protection may be achieved through utilization of a localized, domed lid enclosure assembled on the circuit board. The domed lid enclosure is designed to enclose active devices or other regions of the circuit board that are sensitive to dielectric loading. The relatively thin coatings described herein may be applied before or after the lid is attached to the circuit board. If the coatings are applied after the domed lid enclosure is attached, a hole or aperture is placed in the lid of sufficient size to allow the coatings to uniformly coat the circuitry within the lid enclosure. The lid aperture is then subsequently sealed. Utilization of conductive adhesive or solder to attach the lid allows good electrical contact to be achieved from a metal lid to ground vias placed in the circuit board beneath the lid, thus improving electrical isolation from other channels or regions on the circuit board assembly. The lid also provides mechanical protection against handling damage, particulates, fluids or other contaminants. After lid sealing, a relatively thick environmental coating with less sensitivity to dielectric loss can then be applied on the circuit board and lid assembly without dielectrically loading the sensitive regions beneath the lid assembly. The relatively thick coating may be a material, such as a conventional circuit board parylene, silicone or acrylic conformal coatings, an inorganic coating or composite inorganic and organic coatings as described herein. Use of a relatively thick inorganic or composite inorganic and organic coating may dramatically slow the rate of ingression of moisture into the localized enclosure due to the substantially lower rate of moisture permeation through the inorganic board and adhesive domed lid enclosure attachment materials. The inorganically sealed board material and domed lid enclosure allows the circuit board assembly to be subjected to high humidity or condensing environments without moisture condensation and associated dielectrically loading within the enclosure. The inorganic coating may also lower the rate of moisture permeation into the enclosed cavity and may eliminate or minimize humidity induced damage to the sensitive circuitry. For some applications where the active devices are sufficiently robust to moderate levels of humidity and/or where humidity is controlled at the system level, the device level assembly coating may not be required.

Another major benefit of the relatively thick inorganic or composite inorganic and organic coating on the circuit card assembly is the elimination or mitigation of tin whiskers. Tin whiskers is a major industry reliability problem which has been shown to be reduced, but not eliminated with conventional polymer based conformal coatings. Humidity and compressive internal stress induced on tin coated circuit boards or components accelerates the growth of tin whiskers which puncture through conventional organic or polymer based conformal coatings. Use of the relatively thick inorganic coating or composite inorganic and organic coating substantially decreases the permeation of moisture to the metallized tin surface. The thick inorganic or composite inorganic and organic coating also increases the mechanical resistance of the coating to tin whisker puncture and allows the tin metallization compressive stress to be reduced through superposition of a tensile stress component associated with the inorganic coating.

Although the present disclosure has been described in several embodiments, a myriad of changes, variations, alterations, transformations, and modifications may be suggested to one skilled in the art, and it is intended that the present disclosure encompass such changes, variations, alterations, transformations, and modifications as falling within the spirit and scope of the appended claims.

What is claimed is:

1. A method comprising:
providing a circuit board having an outer surface, the outer surface configured with a plurality of discrete electrical components that are manufactured independently of one another;
coating the outer surface and the plurality of discrete electrical components with a protective dielectric layer, wherein the protective dielectric layer is made of a generally moisture insoluble material having a moisture permeability less than 0.01 gram/meter$^2$/day, a moisture absorption less than 0.04 percent, a dielectric constant less than 10, a dielectric loss less than 0.005, a breakdown voltage strength greater than 8 million volts/centimeter, a sheet resistivity greater than $10^{15}$ ohm-centimeter, and a defect density less than 0.5/centimeter$^2$; and
coating the protective dielectric layer with a dielectric layer, the dielectric layer comprising a dielectric material having a modulus of elasticity less than 3.5 Giga- Pascal (GPa), a dielectric constant less than 2.7, a dielectric loss less than 0.002, a breakdown voltage strength in excess of 2 million volts/centimeter (MV/cm), a temperature stability to 300° Celsius, a defect density less than 0.5/centimeter, and wherein the dielectric material is pinhole free in films greater than 50 Angstroms, and capable of being deposited conformally over and under 3D structures with a thickness uniformity less than or equal to 10%.

2. The method of claim 1, wherein the protective dielectric layer is made of alumina.

3. The method of claim 1, wherein the protective dielectric layer is a nanolaminate comprising alternate combinations of nanolaminate material that is selected from the group consisting of alumina and silicon-dioxide, alumina and fluorinated parylene, alumina and acrylic, and alumina and vapor deposited Teflon (PTFE).

4. The method of claim 1, wherein coating the protective dielectric layer with the dielectric layer comprises coating the protective dielectric layer with a dielectric layer made of a material that is selected from the group consisting of alumina, silica, parylene F, aromatic-fluorinated VT-4, and parylene HT®.

5. The method of claim 1, further comprising coating the protective dielectric layer with an additional protective dielectric layer, the additional protective dielectric layer having a thickness in the range of approximately 50 to 2000 angstroms.

6. The method of claim 1, wherein coating the protective dielectric layer with the dielectric layer comprises coating the protective dielectric layer with a dielectric layer having a thickness in the range of approximately 50 to 1000 angstroms.

7. The method of claim 1, further comprising, prior to coating the outer surface with the dielectric layer, applying a layer of an adhesion promoter to the protective dielectric layer.

8. The method of claim 7, wherein applying the layer of the adhesion promoter comprises applying a layer of gamma-methacryloxypropyltrimethoxysilane to the protective dielectric layer.

9. The method of claim 1, wherein the plurality of discrete electrical components are selected from the group consisting of resistors, capacitors, inductors, diodes, and transistors.

10. The method of claim 1, further comprising placing a domed lid enclosure over at least one of the plurality of discrete electrical components and coating the protective dielectric layer and domed lid enclosure with an additional dielectric coating.

11. The method of claim 10, wherein the additional dielectric coating is a polymer based conformal coating material that is selected from the group consisting of parylene C, parylene D, parylene N, parylene F, acrylic, silicone and polytetrafluoroethylene (PTFE).

12. The method of claim 11, further comprising coating the additional dielectric coating with an inorganic or composite inorganic and organic coating.

13. The method of claim 12, wherein the inorganic or composite inorganic and organic coating is a nanolaminate selected from the group consisting of alumina, silicon nitride, silica, hafnium oxide, beryllium oxide, tantalum oxide zinc oxide, parylene C, parylene D, parylene N, parylene F, parylene AF-4, aromatic fluorinated VT-4, parylene HT, and polytetrafluoroethylene (PTFE).

14. The method of claim 10, wherein the additional dielectric coating is an inorganic coating that is selected from the group consisting of alumina, silicon nitride, silica, hafnium oxide, beryllium oxide, tantalum oxide, and zinc oxide.

15. The method of claim 10, wherein the additional dielectric coating is a nanolaminate inorganic coating consisting of alternate layers selected from the group consisting of alumina, silicon nitride, silica, hafnium oxide, beryllium oxide, tantalum oxide and zinc oxide.

16. The method of claim 1, wherein providing the circuit board includes:
providing the circuit board having the outer surface; and
attaching the plurality of discrete electrical components to the outer surface at an assembly level phase.

17. The method of claim 16, wherein coating the protective dielectric layer with the dielectric layer is performed at the assembly level phase.

18. The method of claim 17, wherein the circuit board further comprises one or more assembly level features that are selected from the group consisting of board traces, wire interconnections, scribe moats, integrated circuit die edges, and external connections to the circuit assembly.

* * * * *